United States Patent
Todd et al.

[11] Patent Number: 5,837,609
[45] Date of Patent: Nov. 17, 1998

[54] FULLY ADDITIVE METHOD OF APPLYING A CIRCUIT PATTERN TO A THREE-DIMENSIONAL, NONCONDUCTIVE PART

[75] Inventors: Michael George Todd, South Lyon; Robert Edward Belke, Jr., West Bloomfield; Andrew Zachary Glovatsky, Ypsilanti, all of Mich.

[73] Assignee: Ford Motor Company, Dearborn, Mich.

[21] Appl. No.: 784,886

[22] Filed: Jan. 16, 1997

[51] Int. Cl.$^6$ ................................................. H01L 21/44
[52] U.S. Cl. ................................................................. 438/678
[58] Field of Search ............................. 156/654, 655.1, 156/656.1; 437/230; 427/429; 438/98, 660, 674, 678

[56] References Cited

U.S. PATENT DOCUMENTS

| | | | |
|---|---|---|---|
| 3,701,317 | 10/1972 | Miyamoto et al. | 101/170 |
| 4,157,407 | 6/1979 | Peiffer | 427/54 |
| 4,522,671 | 6/1985 | Grünwald et al. | 156/235 |
| 4,759,970 | 7/1988 | Seeger, Jr. et al. | 428/209 |
| 4,946,733 | 8/1990 | Seeger, Jr. et al. | 428/209 |
| 4,985,116 | 1/1991 | Mettler et al. | 156/656 |
| 5,066,360 | 11/1991 | Daley et al. | 156/660 |
| 5,090,122 | 2/1992 | Kitagawa | 29/852 |
| 5,168,624 | 12/1992 | Shirai | 29/846 |
| 5,415,888 | 5/1995 | Banerjee et al. | 427/125 |
| 5,531,945 | 7/1996 | Ohya et al. | 246/60 |
| 5,593,739 | 1/1997 | Kickelhain | 427/555 |

OTHER PUBLICATIONS

"Praktische Systemlösungen im Tampondruck: Advanced system solutions in pad printing", Product Technical Brochure, TAMPOflex GmbH, Boschstrasse 5, D71254 Ditzingen, 07156/937010, 4 pgs.

"Original TAMPOPRINT Spezialmaschinenbau Leads Worldwide", Product Technical Brochure, by TAMPOPRINT Firmengruppe, Lingwiesenstr. 1, 70 825 Korntal–Münchingen, 071 50/928–0, 18 pgs.

*Primary Examiner*—Charles L. Bowers, Jr.
*Assistant Examiner*—Reneé R. Berry
*Attorney, Agent, or Firm*—Leslie C. Hodges; Roger L. May

[57] ABSTRACT

A fully additive method of applying a circuit pattern to a three-dimensional, nonconductive part comprises: pretreating the surface of the part; pad-printing a surface catalyst in a solvent carrier onto the surface in the shape of a desired circuit pattern; and applying an electroless copper deposit onto the surface catalyst, thereby providing a copper layer on the surface in the desired circuit pattern shape.

10 Claims, 2 Drawing Sheets

FULLY ADDITIVE METHOD OF APPLYING A CIRCUIT PATTERN TO A THREE-DIMENSIONAL, NONCONDUCTIVE PART

TECHNICAL FIELD

The present invention provides a fully additive method of applying a circuit pattern to a three-dimensional, nonconductive part in which a surface catalyst in a solvent carrier is pad-printed onto the three-dimensional part surface.

BACKGROUND OF THE INVENTION

Conventionally, several methods are known for the production of electronic circuitry on three-dimensional parts. One method is a pattern plating process which consists of surface pretreatment and electroless copper deposition followed by plating resist deposition, photo-imaging the plating resist, solvent developing the plating resist, and electroplating copper. This requires complex, patented photo-imaging techniques to form the electrical traces on three-dimensional surfaces (see U.S. Pat. No. 4,985,116). A second method is the panel plating process which consists of surface treatment and electroless copper deposition followed by electrolytic copper deposition over the entire part. The electrical circuit traces are formed by either laser ablation or selective etching using photo-imaged etch resist. A third method is a metal foil embossing process where copper foil is stamped onto a three-dimensional part using a complex, machined stamping die. These processes are limited by their inherent complexity (plating processes) and there restricted accuracy (embossing processes).

More specifically, the pattern plating method is described with reference to FIG. 1. The plating process comprises the following steps: (a) molding a three-dimensional part (step 10 of FIG. 1); (b) pretreating the surface by acid etching to rough the surface for plating (step 12); (c) applying a surface catalysis by dipping the part in a bath to deposit a palladium/tin complex (step 14); (d) applying an electroless copper deposit which forms a chemical redox reaction such that the copper replaces the palladium and a thin layer of copper is deposited on the part surface (step 16); (e) applying a light sensitive plating resist (step 18); (f) plating resist photo-imaging by applying light to certain areas of the plating resist for polymerization to form the boundaries of the desired circuit pattern (step 20); (g) plating resist developing to strip the unpolymerized plating resist (step 22); (h) applying an electrolytic copper deposit to build up the copper circuit pattern (step 24); (i) removing the plating resist (step 26); and (j) electroless copper etching to remove the thin layer of copper applied in step 16 (step 28). As mentioned above, this process is particularly costly due to the complex photo-imaging techniques required, as well as the equipment costs for the various other steps.

The invention described in U.S. Pat. No. 5,066,360 overcame the complexity of the photo-imaging process while allowing complex circuitry to be formed on three-dimensional surfaces. The process consists of the following steps, as illustrated in FIG. 2: (a) molding a three-dimensional part (step of Figure 2); (b) pretreating the surface of the three-dimensional part (step 32); (c) applying surface catalysis to the pretreated surface (step 34); (d) depositing electroless copper on the three-dimensional part (step 3G); (e) pad-print plating resist onto the surface (step 38); (f) electroplating copper over the electroless copper in areas not covered by the plating resist (step 40); (g) stripping the plating resist (step 42); and (h) etching electroless copper from areas that having plating resist (step 44).

This process eliminates several complex and costly steps in the manufacture of electronic circuitry, such as: plating resist electrodeposition, plating resist photo-imaging, plating resist developing, and the costly manufacture of photo-imaging tools.

It is further desirable to eliminate additional steps of the process.

DISCLOSURE OF THE INVENTION

The present invention improves the above-referenced process by eliminating the application of plating resist, as described above. The novel process comprises pretreating the surface of a three-dimensional part; pad-printing a surface catalyst in a solvent carrier onto the surface in the shape of a desired circuit pattern; and applying an electroless copper deposit onto the surface catalyst, thereby providing a thin copper layer on the surface in the desired circuit pattern shape.

Accordingly, an object of the present invention is to provide a fully additive method of applying a circuit pattern to a three-dimensional, nonconductive part which eliminates the step of pad-printing the plating resist.

The above object and other objects, features, and advantages of the present invention are readily apparent from the following detailed description of the best mode for carrying out the invention when taken in connection with the accompanying drawings.

DETAILED DESCRIPTION OF THE PREFERRED EMBODIMENT

Figures 1, 2:
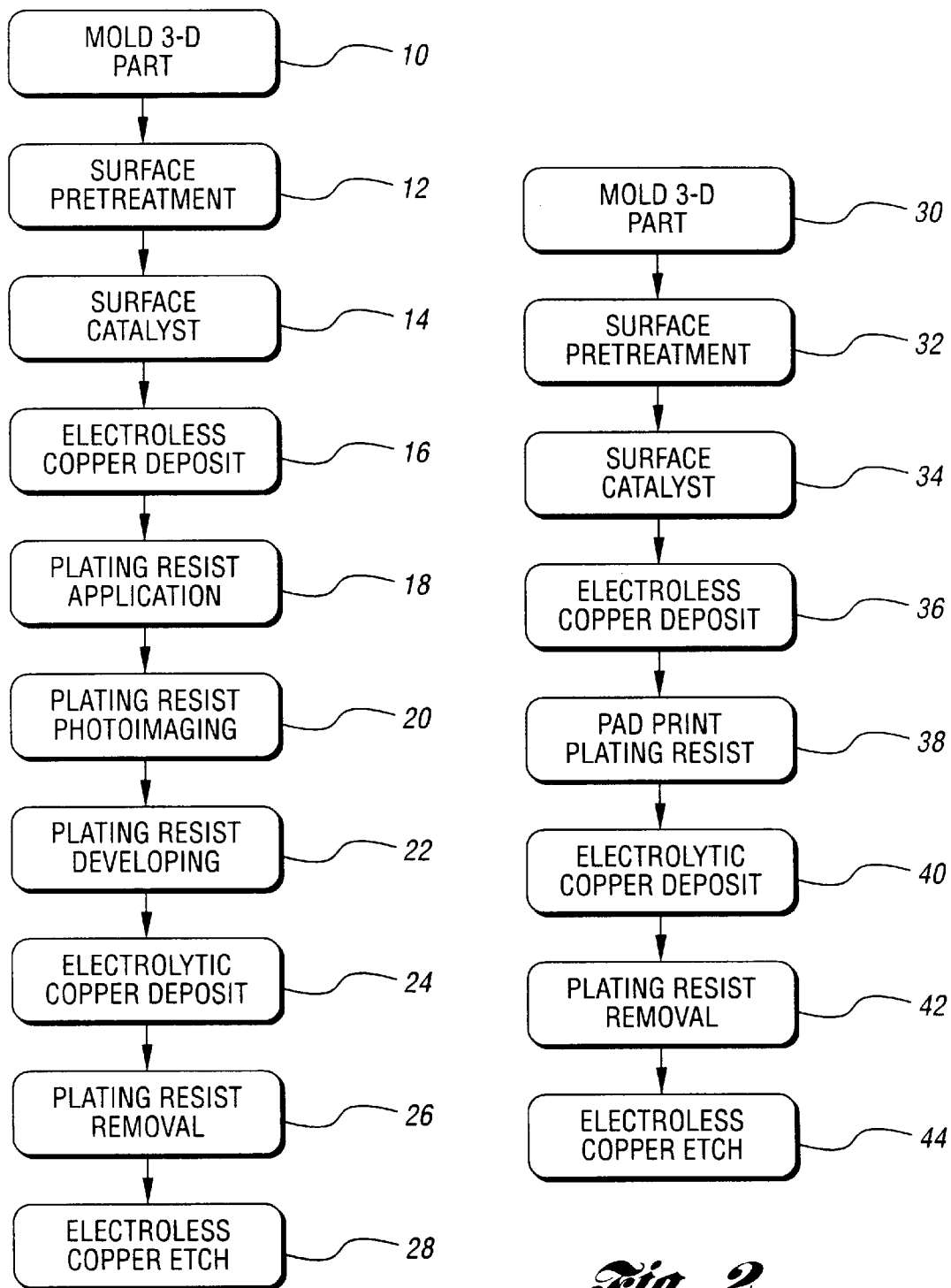
FIG. 1 shows a flow diagram of a conventional plating process.
FIG. 2 shows a flow diagram of a conventional plating process incorporating a step of pad-printing plating resist.
Figure 4:
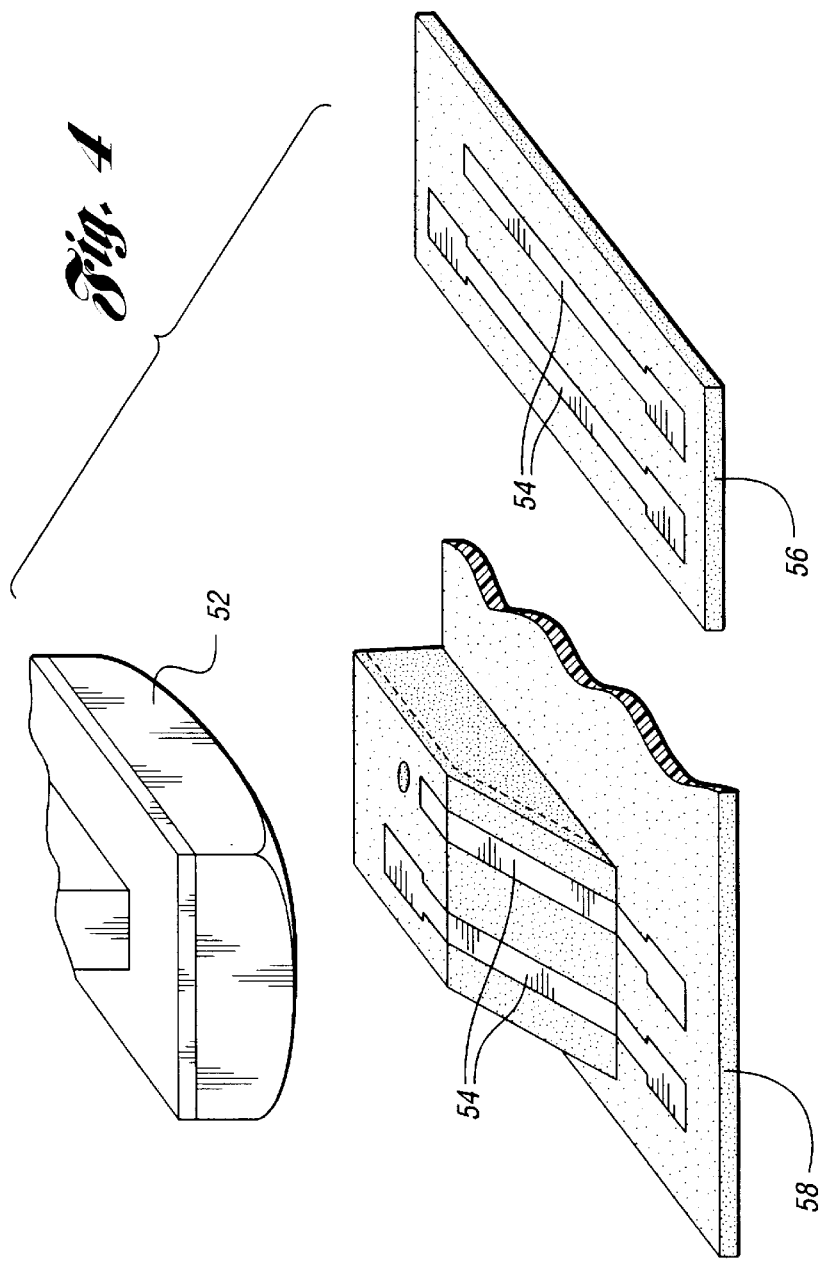
FIG. 4 shows a cut-away perspective view of a transfer pad for applying a surface catalyst in a solvent carrier from a master pattern to a three-dimensional part in accordance with the present invention.
Figure 3:
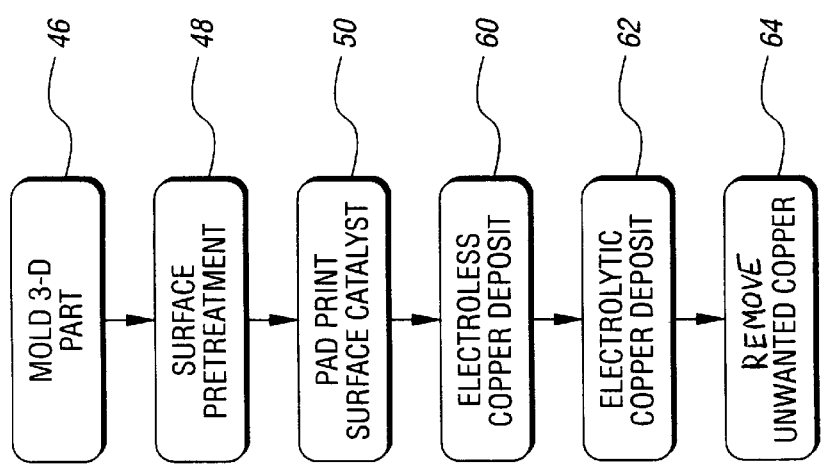
FIG. 3 shows a flow chart of a method for applying a circuit pattern to a three-dimensional, nonconductive part in accordance with the present invention.

Referring to FIGS. 3 and 4, the present invention provides a fully additive method of applying a circuit pattern to a three-dimensional, nonconductive part.

In the preferred embodiment, the first step is to mold a three-dimensional part (step 46 of Figure 3). Of course, this process is applicable to any three-dimensional, nonconductive part. Therefore, this step may comprise molding, extruding, forming, blow molding, stamping, etc., and the three-dimensional part could be plastic, metal with an insulative film, sheet metal with a sprayed lacquer coating, or any non-electrically conductive component, or a conductive component with a non-electrically conductive coating thereon.

The next step is to pretreat the surface of the three-dimensional part, preferably by acid etching to roughen the surface (step 48). This could be accomplished conventionally by applying a strong acid or other known solvent. Other known surface activation methods such as plasma treatment or flame treatment could be used. Alternatively, this step could comprise preparing the surface of the part to receive a pad-printed solvent carrier by applying a nonconductive coating over the three-dimensional part.

The next step is to pad-print a surface catalyst in a solvent carrier onto the surface in the shape of a desired circuit pattern (step 50). Referring to FIG. 4, this step comprises using a deformable transfer pad 52 to pick up a solvent carrier and catalyst pattern 54 from a master pattern support 56, and applying the catalyst and solvent carrier pattern 54 directly onto the three-dimensional part 58 by deforming to assume the shape of the three-dimensional part 58 as the transfer pad 52 is forced against the three-dimensional part 58. The catalyst and solvent carrier have more affinity for the part 58 than the silicone rubber pad 52, so the transfer occurs. The transfer pad 52 is pulled away from the three-dimensional part 58 once the surface catalyst and solvent carrier pattern have been applied to the three-dimensional part. The novelty lies in applying the surface catalyst to the surface of the three-dimensional part by carrying the surface catalyst in a solvent carrier in the catalyst and solvent carrier pattern 54 and pad-printing such pattern onto the three-dimensional part by means of the transfer pad 52.

In the preferred embodiment, the surface catalyst is a palladium/tin complex (stannous chloride/tin) in an epoxy polymer matrix. Alternatively, the surface catalyst could be a palladium/tin complex (stannous chloride/tin) in alcohol. An alternative surface plating catalyst consists of a polymer thick film, such as a metal particle-filled polymer. The filler could be any of the following: Cu, Ni, Ag, Au, Al, Pd, Sn and alloys, metal coated particles of organic and inorganic components (such as glass fibers or mineral particles, or elastomeric polymers). The matrix could be any of the following: organic polymer, sol-gel ceramic, fireable ceramic matrix, or a refractory cement. Of course, the present invention contemplates that other such catalysts and carriers would be sufficient.

Optionally, the part could be passed through an inspection station, such as a UV monitoring system incorporating a UV taggant to check consistency of printing. Alternatively, a pigment method could also be useful in checking consistency of printing.

Turning back to FIG. 3, the next step is to deposit electroless copper onto the surface catalyst (step 60). In this step, the copper replaces the palladium/tin, and the copper builds up to form the circuit pattern.

An optional step for thickening the copper circuit pattern quickly is to apply an electroless copper deposit to connect all of the traces of the circuit pattern, then apply a voltage to the part while in an electrolytic plating bath to build up the copper thickness more quickly. Then, the circuit trace connections would be removed (step 64).

Accordingly, with the present invention, the step of pad-printing a plating resist is eliminated from the print plating resist process described in U.S. Pat. No. 5,066,360, and is therefore an improvement thereon.

While the best mode for carrying out the invention has been described in detail, those familiar with the art to which this invention relates will recognize various alternative designs and embodiments for practicing the invention within the scope of the appended claims.

What is claimed is:

1. A fully additive method of applying a circuit pattern to a three-dimensional, nonconductive part, comprising:

pretreating the surface of the part;

pad-printing a surface catalyst in a solvent carrier onto the surface in the shape of a desired circuit pattern; and applying an electroless copper deposit onto the surface catalyst, thereby providing a copper layer on the surface in the desired circuit pattern shape.

2. The method of claim 1, further comprising applying an electrolytic copper deposit to the surface in electrical communication with the circuit pattern to facilitate thickening of the circuit pattern.

3. The method of claim 2, further comprising removing the electrolytic copper deposit where required.

4. The method of claim 1, wherein said step of pad-printing a surface catalyst in a solvent carrier comprises pad-printing a palladium/tin complex in a solvent carrier.

5. The method of claim 1, wherein said step of pretreating the surface of the part comprises acid-etching the surface.

6. A method of applying a circuit pattern to a three-dimensional, nonconductive part, comprising:

preparing the surface of the part to receive a pad-printed solvent carrier;

pad-printing a surface catalyst in a solvent carrier onto the surface in the shape of a desired circuit pattern; and applying an electroless copper deposit onto the surface catalyst, thereby providing a copper layer on the surface in the desired circuit pattern shape.

7. The method of claim 6, wherein the step of preparing the surface comprises acid-etching the surface.

8. The method of claim 6, further comprising applying an electrolytic copper deposit to the surface in electrical communication with the circuit pattern to facilitate thickening of the circuit pattern.

9. The method of claim 6, wherein said step of pad-printing a surface catalyst in a solvent carrier comprises pad-printing a palladium/tin complex in a solvent carrier.

10. A fully additive method of applying a circuit pattern to a three-dimensional, nonconductive part, comprising:

pretreating the surface of the part by acid etching to create a rough surface;

pad-printing a palladium/ tin complex in a solvent carrier onto the surface in the shape of a desired circuit pattern; and applying an electroless copper deposit onto the surface catalyst, thereby providing a copper layer on the surface in the desired circuit pattern shape.

* * * * *